United States Patent [19]
Chen

[11] Patent Number: 5,885,097
[45] Date of Patent: Mar. 23, 1999

[54] ELECTRICAL CONNECTOR WITH A BOARD LOCKING DEVICE

[75] Inventor: Chu-Mei Chen, Taipei, Taiwan

[73] Assignee: Hon Hai Precision Ind. Co., Ltd., Taipei Hsien, Taiwan

[21] Appl. No.: 919,538

[22] Filed: Aug. 28, 1997

[51] Int. Cl.$^6$ .................................................. H01R 13/62
[52] U.S. Cl. ........................................................ 439/328
[58] Field of Search .................................. 439/325, 326, 439/327, 328

[56] References Cited

U.S. PATENT DOCUMENTS

5,637,004  6/1997  Chen et al. .............................. 439/328

*Primary Examiner*—Neil Abrams
*Assistant Examiner*—Barry M. L. Standig

[57] ABSTRACT

An electrical connector for reliably and electrically connecting a daughter board and a mother board, includes a first insulative housing, a second insulative housing for electrically receiving the daughter board, and a pair of board locking devices. Each board locking device includes a first operative portion for providing a user with a manually locking operation, a protrusion for locking a corresponding notch of the inserted daughter board, and a moveable pin having a second operative portion for providing the user with a manually releasing operation. The moveable pin of the board locking device can be restricted within and linearly slide along a pair of L-shaped slots of the first housing whereby the user can selectively lock or release the daughter board. An elastic supporting portion is adapted to maintain a locking/releasing position of the board locking device with respect to the inserted daughter board under a stable and reliable situation.

19 Claims, 8 Drawing Sheets

ELECTRICAL CONNECTOR WITH A BOARD LOCKING DEVICE

BACKGROUND OF THE INVENTION

1. Field of the Invention

The invention relates to an electrical connector for electrically connecting a daughter board and a mother board, and particularly to an electrical connector having a board locking device for reliably latching an inserted daughter board.

2. The Prior Art

Most computer systems with mother boards are deposited with a plurality of specific electrical connectors for receiving a variety of selective daughter boards, as called "the extensive cards", having some electrical apparatus or chips thereon, for providing some required functions. Such electrical connector mainly includes an elongated groove having a plurality of contacts therein for electrically engaging with some pads on a surface of the daughter board, and a pair of board locking devices for latching two opposed edges of the daughter board to maintain a stably electrical connection between the daughter board and the connector. Some of the board locking devices generally are configured, as a pivotal ejector with a simple clamping structure, to remove the inserted daughter board from the groove of the connector, but not to lock the daughter board. Additionally, the clamping structure thereof is merely adapted to guide or loose clamp the daughter board in a specific direction, but can not effectively lock the daughter board in both longitudinal and horizontal directions with respect to the daughter board.

Figure 1:
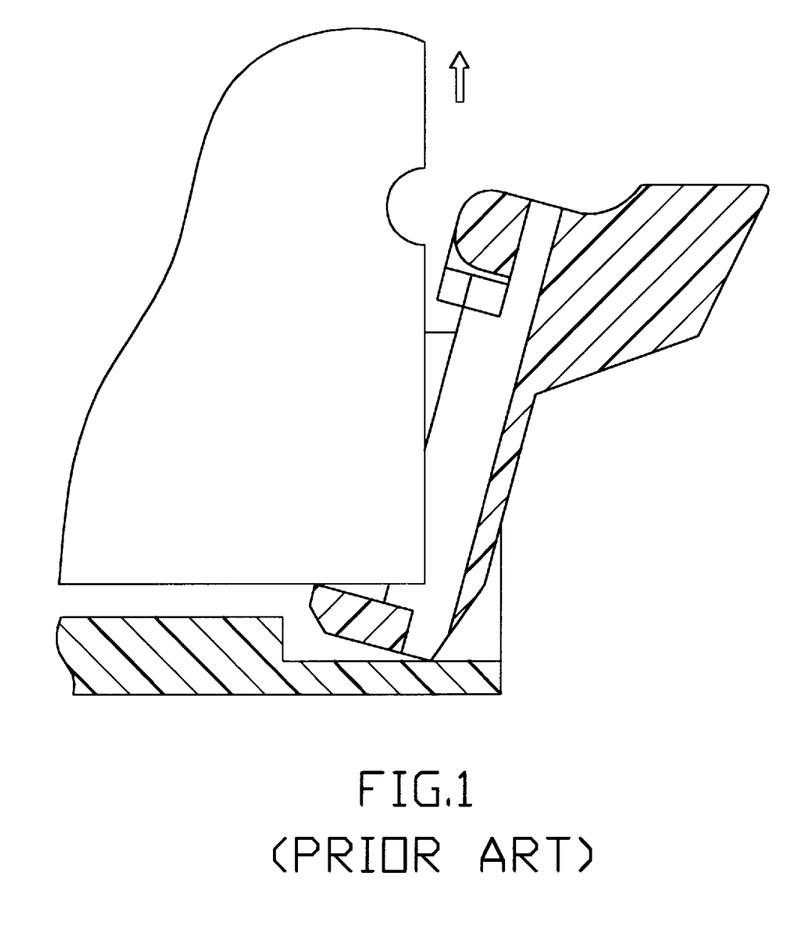
FIG. 1 is a partially cross-sectional view of a conventional electrical connector wherein a daughter board is removed from the connector by an ejector.

Although, another type board locking devices are designed as a latch-like structure which can lock the daughter board as shown in FIG. 1, the latch-like board locking devices merely accommodate a light daughter board on which may be just mounted with a little micro-chips. When a daughter board mounted with some heavy electrical apparatus like a CPU (Central Process Unit) and a micro-fan thereon is installed in the conventional electrical connector, such inserted daughter board may bias one side of the connector to result in a poorly electrical contact between the connector and the daughter board, due to the center of gravity of the board daughter board being unstable. Additionally, since the board locking device lacks any supporting structure to maintain the locking position of the board locking device with respect to the daughter board, when such connector receiving the heavy daughter board is located in a vibrating environment, said poor contact manner may be worsened. For example, the daughter board may deviate from the locking condition of the board locking device. The conventional electrical connectors with a board locking device as aforementioned, can be referred to U.S. Pat. Nos. 3,993,390, 4,057,879, 4,832,617, 4,986,765, 5,207,598, 5,259,793, 5,364,282 and 5,429,523, and Taiwan Patent Application Nos. 78,102,902, 79,105,203, 79,211, 470, 81,212,446, 82,213,513, 82,213,515 and 82,217,323.

Accordingly, for resolving the above disadvantages, an object of the invention is to provide an improved electrical connector which has a first insulative housing, a second insulative housing and a pair of board locking devices wherein the first housing has opposed acting cavities each forming a pair of L-shaped slots thereon, and each board locking device forms at least a moveable pin thereon. By means of the cooperation between the slots and the pin, the board locking device can linearly slide in said acting cavity and selectively lock or release an inserted daughter board.

Another object of the invention is to provide an improved electrical connector with a pair of board locking devices which each further includes an elastic supporting portion for maintaining a locking/releasing position of the board locking device with respect to the inserted daughter board under a stable and reliable situation.

Another object of the invention is to provide an improved electrical connector with a pair of board locking devices which each further includes a first operative portion formed on a main body of the board locking device for providing a user with a manually locking operation with respect to the inserted daughter board.

Another object of the invention is to provide an improved electrical connector with a pair of board locking devices which each further includes at least a moveable pin having a second operative portion exposed to the outside of the housing for providing the user with a manually releasing operation with respect to the inserted daughter board.

SUMMARY OF THE INVENTION

According to an aspect of the invention, an electrical connector for electrically connecting a daughter board and a mother board, includes a first insulative housing, a second insulative housing for electrically receiving the daughter board, and a pair of board locking devices. Each board locking device has a first operative portion for providing a user with a manually locking operation with respect to the inserted daughter board, a protrusion for locking a corresponding notch of the inserted daughter board, and at least a moveable pin having a second operative portion for providing the user with a manually releasing operation with respect to the inserted daughter board. The moveable pin linearly slides along a pair of L-shaped slots of the first housing whereby the user can selectively lock/release the daughter board. An elastic supporting portion is adapted to maintain the locking/releasing position of the board locking device with respect to the inserted daughter board under a stable and reliable situation.

DETAILED DESCRIPTION OF THE PREFERRED EMBODIMENTS

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

It will be noted here that for a better understanding, most of like components are designated by like reference numerals throughout the various figures in the embodiments. A first embodiment of the present invention is shown with reference to FIGS. 2 & 3 that an electrical connector (1) for electrically connecting a daughter board (40) and a mother board (not shown), mainly includes a first insulative housing (10), a second insulative housing (30) and a pair of board locking devices (11).

Figure 2:
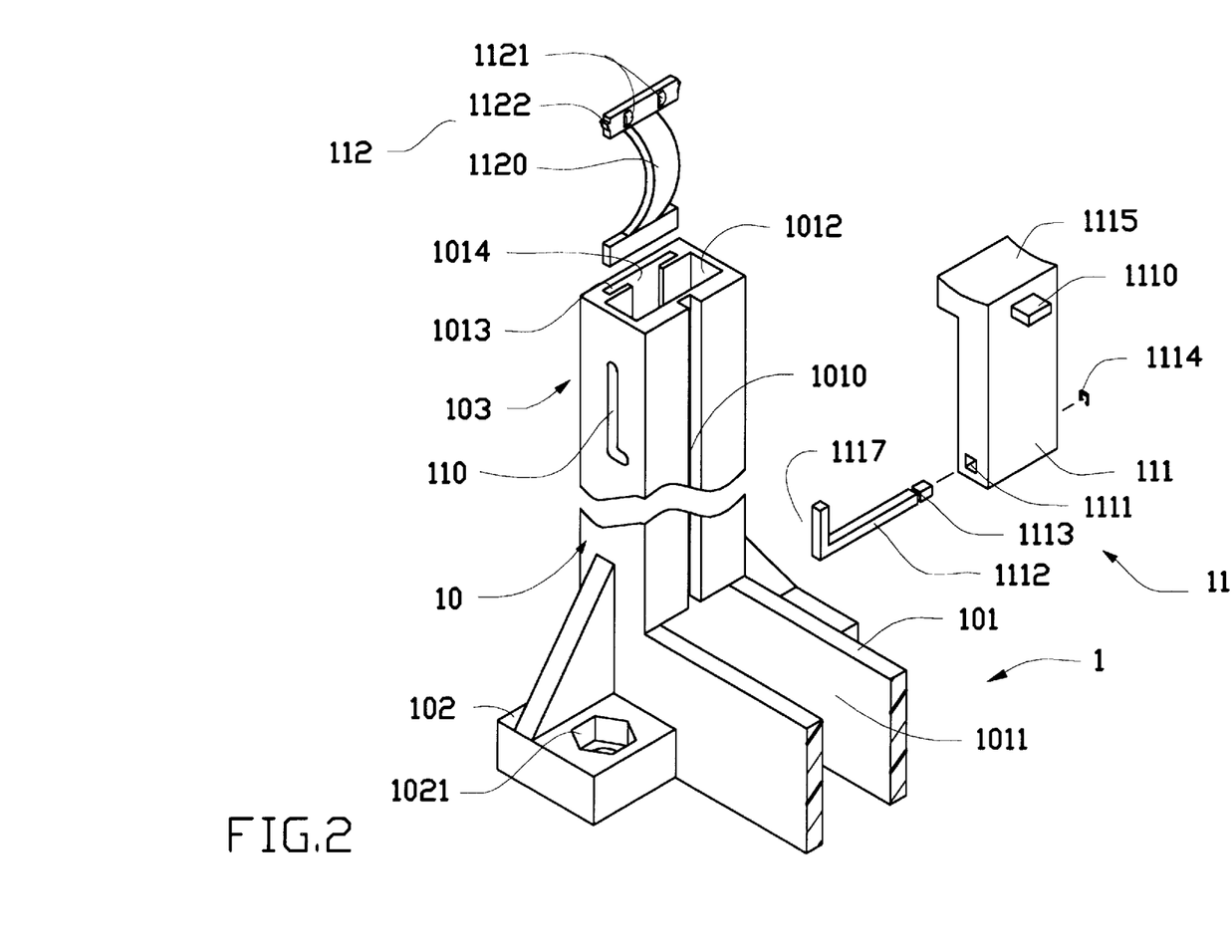
FIG. 2 is a partially exploded perspective view of an electrical connector of a first embodiment connector according to the present invention, only showing one of opposed ends of the connector.
Figure 3:
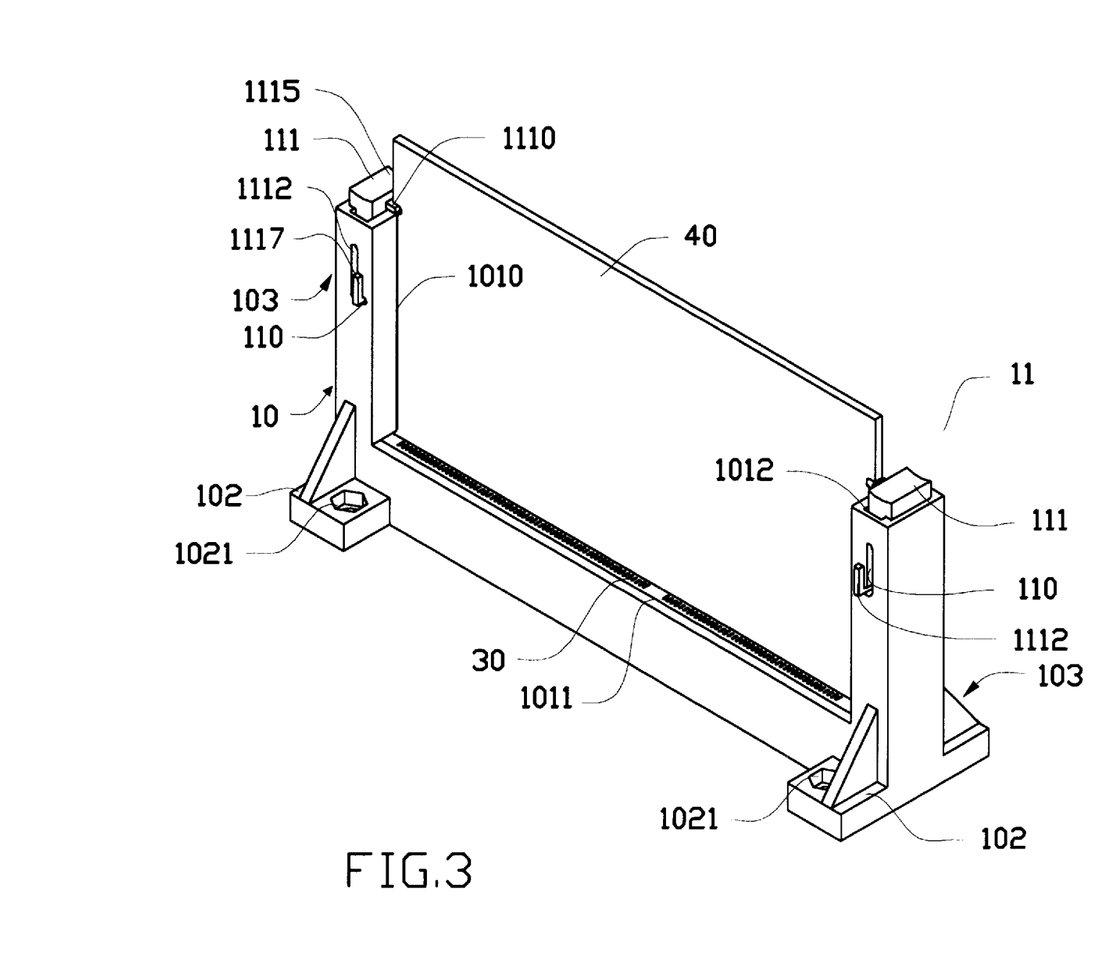
FIG. 3 is a perspective view of the electrical connector of the first embodiment according to the present invention wherein an inserted daughter board is locked by a pair of opposed board locking devices.

As shown in FIGS. 2–3, the first housing (10) is integrally defined with two vertical opposed towers (103) and two spaced sidewalls (101) located between said towers. The sidewalls (101) and the towers (103) surround a space to define a hollow portion (1011). Each tower (103) is supported by a pair of fastening portions (102) respectively formed at two lateral sides of the tower (103), wherein each fastening portion (102) having a screw hole (1021) adapted to receive a bolt to mount the first housing (10) on the mother board. A clamping groove (1010) vertically extends upward from the hollow portion (1011) along an outer surface of the tower (103) for guiding and clamping the inserted daughter board (40).

Each tower (103) further forms an acting cavity (1012) and an embedded cavity (1013) wherein both of the cavities (1012, 1013) are communicated with each other by an aisle (1014). A pair of L-shaped slots (110) are respectively formed on two opposed lateral walls defining said acting cavity (1012), so that the acting cavity (1012) is also communicated with an exterior via the L-shaped slots (110). It is noted that each L-shaped slot (110) is configured with a long slot and a short slot normal to the long slot.

Figure 4:
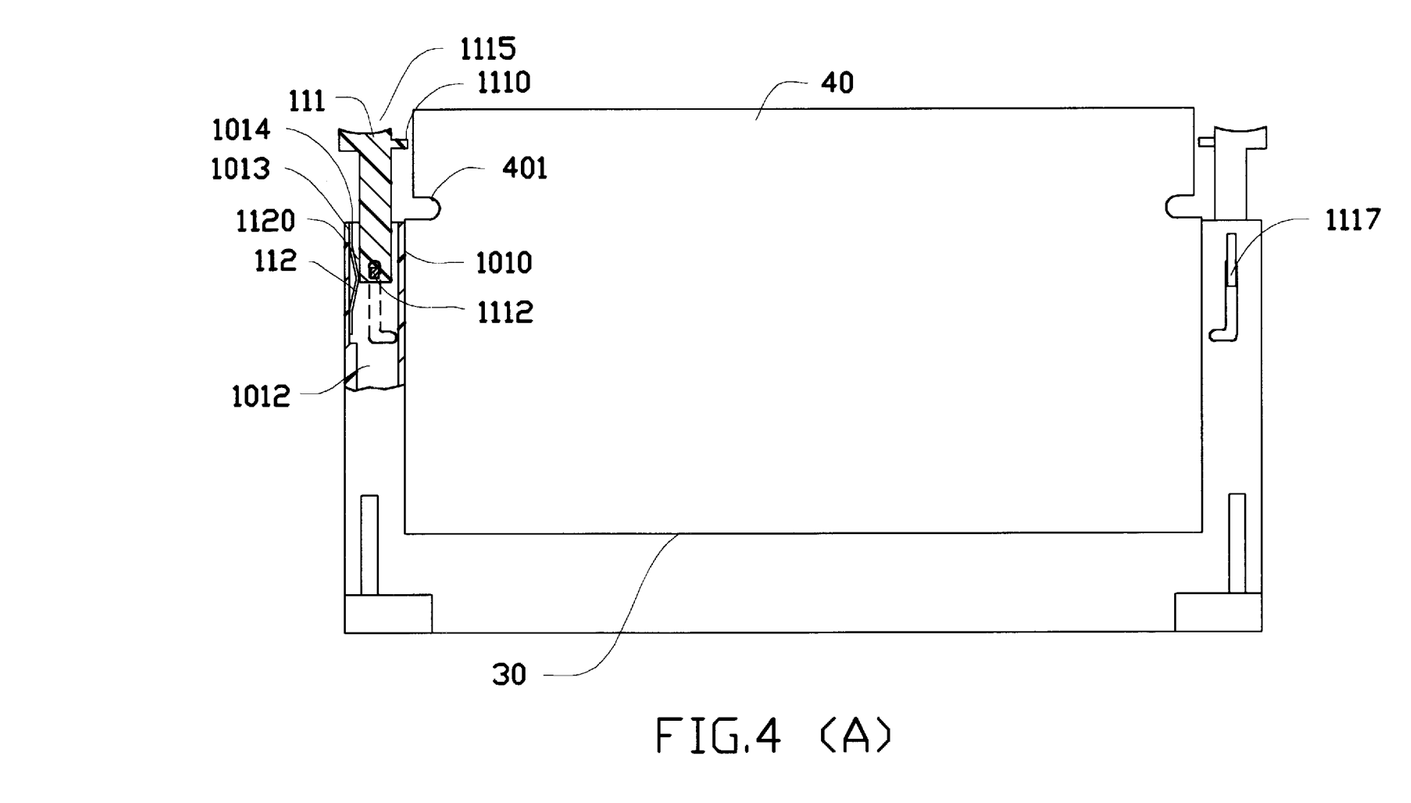
FIGS. 4A–4B are successively operative views of the board locking device according to FIG. 3, wherein a cavity portion of the connector is partially vertical crossed.

The board locking device (11) installed within the corresponding tower (103) includes a rectangular main body (111). A concave first operative portion (1115) is formed on a top of the main body (111) for providing a user with a manually locking operation with respect to the daughter board (40). A protrusion (1110) horizontally extends from a vertical surface of main body (111) toward a space above said hollow portion (1011) for latching a corresponding notch (401) of the daughter board (40) as shown in FIG. 4C. A square hole (1111) extends through two opposed lateral walls adjacent to a bottom of the main body (111) and is adapted to receive a moveable pin (1112). The moveable pin (1112) has a second operative portion (1117) as a crank handle formed on a free end thereof for providing the user with a manually releasing operation with respect to the daughter board (40). An annular crack (1113) is adjacent to another end of the moveable pin (1112) for receiving a C-shaped ring (1114).

The board locking device further includes an elastic supporting portion (112) defined with two horizontal strips (not labeled) and a curved abutment (1120) vertically connected with said strips wherein one of strips is arranged with a plurality of horizontal bards (1121) and vertical bards (1122) for retaining the supporting portion (112) in the embedded cavity (1013) of the tower (103), and another strip is a free end.

Therefore, when the board locking device (11) is installed within the associated tower (103), the strips of the elastic supporting portion (112) are received within the embedded cavity (1013) of the tower (103), and a middle portion of the curved abutment (1120) of the elastic supporting portion (112) is extended into the acting cavity (1012) of the tower (103) via the aisle (1014) as shown in FIG. 4A. In addition, when the main body (111) of the board locking device (11) is received within the associated acting cavity (1012) of the tower (103), said the moveable pin (1112) can be inserted through the slots (110) of tower (103) and the square holes (1111) of the board locking device (11) until the annular crack (1113) of the moveable pin (1112) is exposed to the outside to receive the C-shaped ring (1114) therein. The C-shaped ring (1114) is adapted to prevent the moveable pin (1112) from deviating from the square hole (1111), so that the movement of the main body (111) of the board locking device (11) is restricted in the slots.

The second housing (30) as shown in FIG. 3 can be a conventional edge card connector which has an elongated groove (not labeled) for receiving the daughter board (40) therein, and a plurality of passageways (not labeled) arranged in opposed sides of said elongated groove for respectively receiving a plurality of contacts (not labeled) for electrically engaging with the inserted daughter board. The second housing (30) is installed within the hollow portion (1011) of the first housing (10).

As to the locking/releasing operation with regard to the inserted daughter board (40), it is indicated in FIGS. 4A–4C. First, as shown in FIG. 4A, the moveable pin (1112) of each board locking device (11) is arranged in a tip of the long slot (110) as a releasing position with respect to the daughter board (40). Due to the thickness of the whole main body (111) being less than a receiving space in the acting cavity (1012), the front wall of the main body (111) can always keep a clearance with regard to the inside of the acting cavity (1012). Therefore, the protrusion (1110) of the main body (111) does not directly interfere or engage with the daughter board (40), and the daughter board (40) can be freely inserted or withdrawn. However, it is noted that when the inserted daughter board (40) is inserted into the elongated groove of the second housing (30), the inserted daughter board (40) can be restricted moving along a horizontal direction by the clamping grooves (1010) of the towers (103) in advance.

Second, when the first operative portion (1115) of the board locking device (11) is pressed downward by a manual operation, the whole main body (111) linearly slide downward in the acting cavity (1012) by means that the moveable pin (1112) of the board locking device (11) is restricted within and linearly slide along the long slot (110). At the time, the back wall of the sliding main body (111) can compress the elastically curved abutment (1120) of the supporting portion (112) in the acting cavity (1012), so that the free strip of the supporting portion (112) slides downward in the embedded cavity (1013) as shown in FIG. 4B. Then, the sliding moveable pin (1112) reach a bottom of the long slot (110) where the moveable pin (1112) will be pushed by the resilient force of the curved abutment (1120) to linearly slide along the horizontal short slot (110) until the moveable pin (1112) reaches a closed end of the short slot (110) as being a locking position with regard to the daughter board (40). Correspondingly, the whole main body (111) also linearly slides forward to shorten the clearance with regard to the inside of acting cavity (1012) and the protrusion (1110) of the main body (111) can lock the corresponding notch (401) of the daughter board (40) in a vertical direction as shown in FIG. 4C.

Attention to the locking operation with regard to the daughter board (40), due to an action of the resilient force of the supporting portion (112), the locking position of protrusion (1110) of the main body (111) can be maintained in a stable and reliable situation.

In contrast, when the user intends to release the daughter board (40), the user can pull the exposed second operative portion (1117) of the moveable pin (1112) along a reverse route from the closed end of the horizontal short slot (110) to the tip of vertical long slot (110). And the curved abutment (1120) of the supporting portion (112) is compressed again by the back wall of the main body (111) of the board locking device (11). Finally, the main body (111) of the board locking device (11) can return to the releasing position as shown in FIG. 4A, and the resilience of the curved abutment (1120) of the supporting portion (112) can recover to keep the main body (111) in said releasing position unless the main body is pressed again by an exterior force. Therefore, based on aforementioned, it is understood that the supporting portion (112) can be adapted to support the board locking device (11) for maintaining the locking/releasing position of the board locking device (11) with respect to the inserted daughter board (40).

Figure 5:
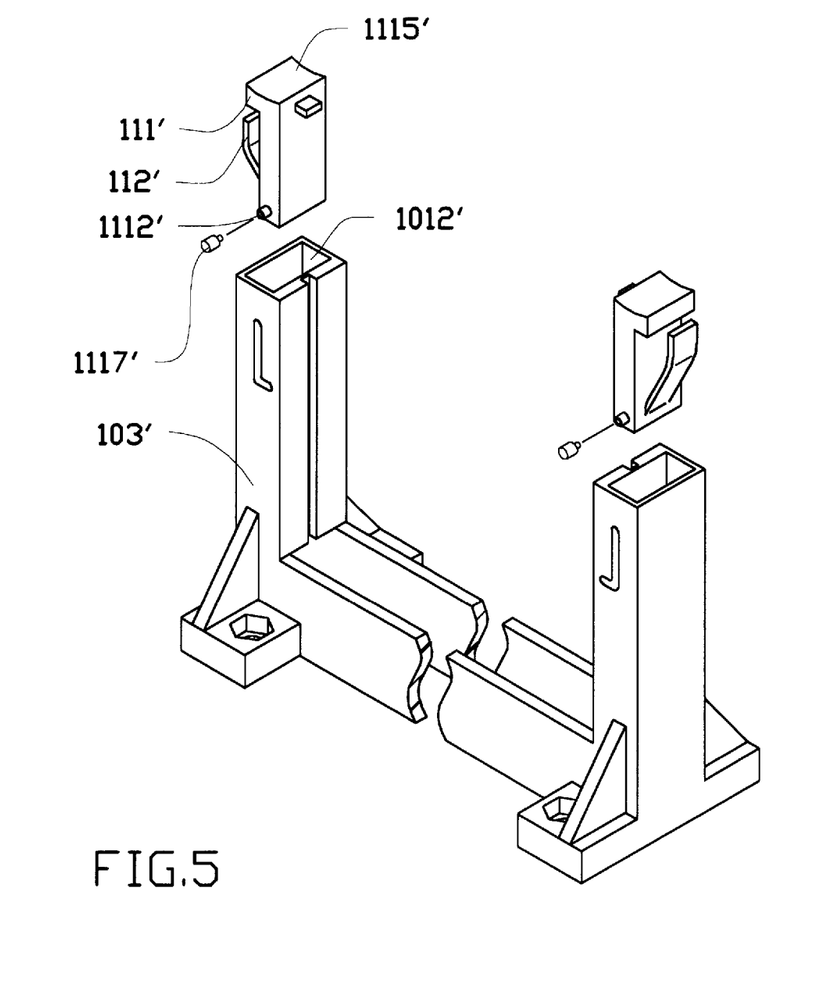
FIG. 5 is an exploded perspective view of an electrical connector of a second embodiment according to the present invention.
Figure 6:
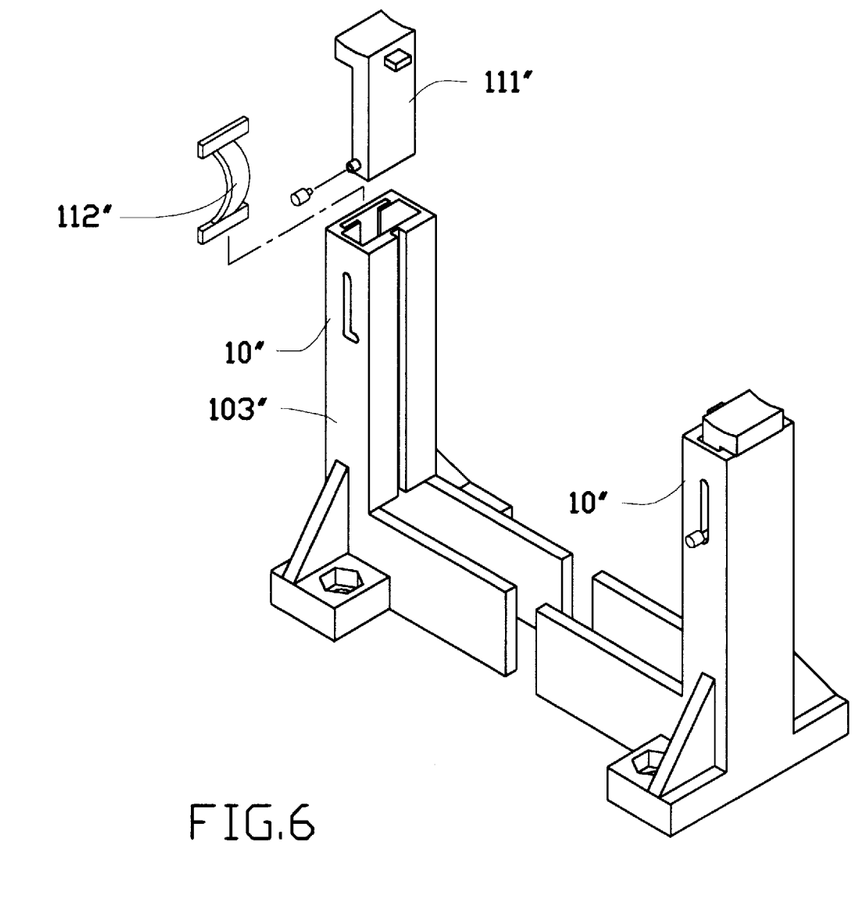
FIG. 6 is an exploded perspective view of an electrical connector of a third embodiment according to the present invention.

In addition, in a second embodiment of the present invention as shown in FIG. 5, it is only different from the first embodiment that an elastic supporting portion (112') and a pair of moveable pins (1112') all are integrally formed with a main body (111') wherein each moveable pin (1112') can be attached with a second operative portion (1117') as a button forming a screw thereon. Furthermore, based on the similar technology, a third embodiment of the present invention as shown in FIG. 6 is that replacing the moveable pin (1112) of first embodiment with the moveable pin (1112') of second embodiment.

Certainly, for the convenience of manufacturing, said second housing (30) of each embodiment can be integrally formed with the corresponding first housing.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, person of ordinary skill in this field are to understand that all such equivalent structures are to be included within the scope of the following claims.

We claim:

1. An electrical connector for electrically connecting a daughter board to a mother board, comprising:
   a housing means having an elongated groove with a plurality of contacts aside for electrically engaging with the daughter board, and at least a cavity having at least a slot therein;
   a board locking device received within said cavity and at least having a main body, an operative portion for providing a manual operation, a protrusion adjacent to said operative portion for locking the daughter board, and a moveable pin restricted within and linearly sliding along the corresponding slot of the cavity whereby the board locking device can selectively lock or release the inserted daughter board.

2. The electrical connector as described in claim 1, wherein said housing means is defined with at least a first housing and a second housing.

3. The electrical connector as described in claim 1, wherein said slot is configured with a vertical long slot and a horizontal short slot.

4. The electrical connector as described in claim 1, wherein said moveable pin forms a handle and a crack thereon and is retentively received within a corresponding square hole of the main body of the board locking device.

5. An electrical connector for electrically connecting a daughter board to a mother board, comprising:
   a housing means having an elongated groove with a plurality of contacts for electrically engaging with the daughter board, and at least a cavity;
   a board locking device received within said cavity and at least having a main body, and an operative portion for providing a manual operation, and a protrusion adjacent to said operative portion for locking the daughter board; and
   means located between said board locking device and the cavity of the housing, and defining at least a first position and a second position;
   wherein the board locking device linearly slides between the first position and the second position of the means for selectively locking or releasing the inserted daughter board.

6. The electrical connector as described in claim 5, wherein said means includes a moveable pin and the slot for receiving said moveable pin therein.

7. The electrical connector as described in claim 6, wherein said slot is configured with a vertical long slot and a horizontal short slot.

8. The electrical connector as described in claim 7, wherein said first position is a tip of the vertical long slot, and said second position is a closed end of the horizontal short slot.

9. The electrical connector as described in claim 6, wherein said moveable pin forms a handle and a crack thereon and is retentively received within a corresponding square hole of the main body of the board locking device.

10. An electrical connector for electrically connecting a daughter board to a mother board, comprising:
    a housing means having an elongated groove with a plurality of contacts for electrically engaging with the daughter board, and at least an cavity;
    a board locking device received within said cavity and at least having a main body, and an operative portion for providing a manual operation, and a protrusion adjacent to said operative portion for locking the daughter board;
    means for guiding said board locking device to linearly slide in said cavity to selectively lock/releas the inserted daughter board; and
    an elastic supporting portion supporting the board locking device for maintaining a locking or releasing position of the board locking device with respect to the inserted daughter board.

11. The electrical connector as described in claim 10, wherein said means includes a moveable pin and the slot for receiving said moveable pin therein.

12. The electrical connector as described in claim 10, wherein said elastic supporting portion includes two strips and a curved abutment for engaging with a surface of the main body of board locking device.

13. The electrical connector as described in claim 12, wherein one of strips has a plurality of barbs for retaining the supporting portion in a cavity of the housing means, and another one is a free end.

14. An electrical connector for electrically connecting a daughter board to a mother board, comprising:
    a housing means having an elongated groove with a plurality of contacts for electrically engaging with the daughter board, and at least a cavity;

a board locking device received within said cavity and having a main body, a first operative portion for providing a user with a manually locking operation, a protrusion adjacent to said operative portion for locking the daughter board, and a second operative portion for providing the user with a manually releasing operation; and means for guiding said board locking device to linearly slide in said cavity to selectively lock or release the inserted daughter board.

15. The electrical connector as described in claim 14, wherein said means includes a moveable pin and the slot for receiving said moveable pin therein.

16. The electrical connector as described in claim 15, wherein said second operative portion is located on the moveable pin.

17. The electrical connector as described in claim 14, wherein said first operative portion is formed on a top of the main body.

18. The electrical connector as described in claim 16, wherein said second operative portion is a crank handle.

19. Mechanism of an electrical connector for securely locking a daughter board to the connector wherein said connector includes a housing means having an elongated groove with a plurality of contacts aside for engagement with the daughter board, said mechanism comprising:

a board locking device positioned at least an end of the housing means and comprising a main body with a protrusion inwardly extending adjacent a top portion of the main body wherein said board locking device can be upwardly moved to an upper releasing position or inwardly moved to a lower locking position; and means for properly and reliably supporting the board locking device in either the upper releasing position or the lower locking position.

* * * * *